United States Patent
Sakai et al.

(12)

(10) Patent No.: US 6,399,212 B1
(45) Date of Patent: Jun. 4, 2002

(54) SILICON DIOXIDE-COATED POLYOLEFIN RESIN AND PROCESS FOR ITS PRODUCTION

(75) Inventors: Yasuto Sakai; Yasuhiro Saito; Hiroyuki Inomata, all of Osaka-fu (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 67 days.

(21) Appl. No.: 09/680,230

(22) Filed: Oct. 6, 2000

(30) Foreign Application Priority Data

Oct. 18, 1999 (JP) .......................................... 11-295815
Mar. 17, 2000 (JP) ....................................... 2000-076885
Jul. 26, 2000 (JP) ....................................... 2000-224760

(51) Int. Cl.⁷ ............................................. B32B 27/32
(52) U.S. Cl. ...................................... 428/448; 428/451
(58) Field of Search .............................. 427/387, 419.5, 427/419.6, 419.8, 533, 535; 428/448, 451

(56) References Cited

U.S. PATENT DOCUMENTS 5,641,559 A * 6/1997 Namiki ........................ 428/215

FOREIGN PATENT DOCUMENTS

JP            6-168625          6/1994

JP           10-152549          6/1998

* cited by examiner

Primary Examiner—D. S. Nakarani
(74) Attorney, Agent, or Firm—Dike, Bronstein, Roberts & Cushman

(57) ABSTRACT

The present invention is to establish a process for production of highly durable organic silicon-based coatings with satisfactory adhesive property on polyolefin resins.

A polyolefin resin, wherein after hydrophilic treatment of the surface of the polyolefin resin it is coated with a coating solution containing a silicon compound or its hydrolysate with an organic functional group represented by general formula (1): $R^1{}_n Si(R^2)_{4-n}$ (where $R^1$ is an organic functional group with a methacryloxy group, $R^2$ is one or a plurality of hydrolyzable groups selected from among alkoxyl groups, acetoxyl groups and chlorine, and n is an integer of up to 3), and then dried to obtain a primary coating, over which a silicon dioxide coating is formed. Alternatively, the primary coating may be obtained by coating and drying a coating solution containing a plurality of different silicon compounds or their hydrolysates from among silicon compounds and their hydrolysates with an organic functional group represented by general formula (2): $R^3{}_n Si(R^2)_{4-n}$ (where $R^3$ is an organic functional group with a functional group selected from among methacryloxy, vinyl, allyl and amino groups, $R^2$ is one or a plurality of hydrolyzable groups selected from among alkoxyl groups, acetoxyl groups and chlorine, and n is an integer of up to 3).

5 Claims, No Drawings

SILICON DIOXIDE-COATED POLYOLEFIN RESIN AND PROCESS FOR ITS PRODUCTION

DETAILED DESCRIPTION OF THE INVENTION

1. Technical Field of the Invention

The present invention relates to a silicon dioxide-coated polyolefin resin and a process for its production.

2. Prior Art

Polyolefin resins have a wide variety of uses arising from their excellent properties. For example, the polyolefin resin composed of a cyclopentene-based polymer described in Japanese Unexamined Patent Publication No. 168625 of 1994 has excellent electrical resistance and low water absorption, and therefore exhibits the feature of dimensional stability even under highly humid conditions. The polyolefin resin composed of a norbornene-based open-ring polymer described in Japanese Unexamined Patent Publication No. 152549 of 1998 has excellent optical properties, including transparency, water resistance and birefringence.

These polyolefin resins are widely used in optical parts, electronic parts, automobile parts and the like because of their excellent properties, but since they lack functional groups and therefore generally have low adhesion to other coatings or materials, it is difficult to form coating layers over their surfaces and this has hampered efforts to take full advantage of their excellent properties.

In particular, polyolefin resins offer considerable potential advantages for use in magnetic recording media and other electronic devices where their excellent properties such as low moisture absorption, heat resistance and chemical resistance are utilized, but formation of highly adhesive and durable coating layers could further increase their potential advantages as base materials for electronic devices and other devices having layers consisting of magnetic recording media additionally formed over the coating layers.

It is therefore an object of the present invention to establish a process for formation of an organic silicon-based coating with high adhesive property to polyolefin resins and high durability.

SUMMARY OF THE INVENTION

These objects of the invention can be achieved by the following construction.

Specifically, it is a process for production of a silicon dioxide-coated polyolefin resin wherein, after hydrophilic treatment of the surface of a polyolefin resin, it is coated with a primary coating composed of an organic silicon compound and the base is then contacted with a solution containing silicofluoric acid with silicon dioxide in a supersaturated state, to form a silicon dioxide coating on the primary coating.

The primary coating is preferably obtained by applying and subsequently drying a coating solution containing a silicon compound or its hydrolysate with an organic functional group represented by the following general formula (1)

$$R^1{}_nSi(R^2)_{4-n} \tag{1}$$

where $R^1$ is an organic functional group with a methacryloxy group, $R^2$ is one or a plurality of hydrolyzable groups selected from among alkoxyl groups, acetoxyl groups and chlorine, and n is an integer of up to 3.

The primary coating of the invention is even more preferably obtained by applying and subsequently drying a coating solution containing a plurality of different silicon compounds or their hydrolysates from among silicon compounds and their hydrolysates with an organic functional group represented by general formula (2)

$$R^3{}_nSi(R^2)_{4-n} \tag{2}$$

where $R^3$ is an organic functional group with a functional group selected from among methacryloxy, vinyl, allyl and amino groups, $R^2$ is one or a plurality of hydrolyzable groups selected from among alkoxyl groups, acetoxyl groups and chlorine, and n is an integer of up to 3.

When the primary coating of the invention is a primary coating obtained from a coating solution containing a plurality of silicon compounds of general formula (2), the properties such as adhesive property onto polyolefin resins is greater compared to using a primary coating obtained from a coating solution containing only a silicon compound of general formula (1).

The present invention also encompasses silicon dioxide-coated polyolefin resins obtained by the aforementioned production process.

[Function]

According to the invention, after hydrophilic treatment of a polyolefin resin, an organic silicon coating is formed and it is then immersed in a silicofluoric acid aqueous solution containing silicon dioxide in a supersaturated state, to form a silicon dioxide coating.

By laying an organic silicon film on the surface of a polyolefin resin by the method described above, it is possible to improve adhesive property between the polyolefin resin that has no functional groups, and silicon dioxide coatings. Here, providing an organic silicon film after hydrophilic treatment of the surface of the polyolefin resin to form a silicon dioxide coating can result in even more reliable improvement in adhesive property between the polyolefin resin and the silicon dioxide coating.

The polyolefin resin used as the base may be a polyalkene such as polyethylene or polypropylene, or a cycloolefin, including the cyclopentene-based open-ring polymer described in Japanese Unexamined Patent Publication No. 168625 of 1994 and the norbornene-based open-ring polymer described in Japanese Unexamined Patent Publication No. 152549 of 1998.

The hydrophilic treatment of the surface of the polyolefin resin base may be carried out by any method that allows hydrophilic treatment of resin base surfaces, and for example, corona discharge treatment, plasma treatment, UV ozone treatment, ozonized water washing and the like may be used for oxidation of the surface. Without this step it is not possible to form a satisfactory coating because of poor adhesive property, even though formation of a silicon dioxide coating is possible. UV ozone treatment, corona discharge treatment, plasma treatment by high frequency plasma discharge and other types of treatment or ozonized water washing can accomplish hydrophilic treatment without impairing the surface of the polyolefin resin. Such treatment methods also have the function of removing dirt and oil from the polyolefin resin surface, in addition to oxidation or activation of the surface. A concrete example of hydrophilic treatment will now be explained.

UV ozone treatment is carried out by irradiation for 1–20 minutes at 20 mW/cm² in an oxygen-containing atmosphere, with a distance of 20–50 mm between the polyolefin resin base and the UV lamp. The polyolefin resin base maybe rapidly subjected to hydrophilic treatment by heating at 30–100° C.

Corona discharge is accomplished by creating a corona discharge between the electrode and the base surface while maintaining a distance of 0.5–8 mm between the electrode and the polyolefin resin base and moving the base under the electrode at a speed of 1–100 mm/sec. The discharge is accomplished in air with application of a voltage of 10–30 kV at a cycle of 15 kHz.

Plasma treatment by high frequency plasma discharge is a method in which a glow discharge is created between the electrode and the base in a reduced pressure oxygen atmosphere, for hydrophilic treatment of the polyolefin resin surface.

Ozonized water washing is a method in which the base is immersed for a few minutes in water that has dissolved ozone having oxidizing property at about a few ppm, for hydrophilic treatment of the surface.

These types of treatment can accomplish hydrophilic treatment of the resin surface. Observation of the elemental composition of the surface by XPS reveals a larger amount of oxygen than before hydrophilic treatment, with the oxygen introduced only near the resin surface in the form of hydroxyl groups, carbonyl groups and carboxyl groups. These functional groups serve as bonding sites with the coating, allowing formation of a satisfactory coating. According to XPS, an elemental ratio of oxygen and carbon (O/C) of at least 0.08 allows formation of a coating with satisfactory adhesive property. The water droplet contact angle of the base surface after treatment has been confirmed to be no greater than about 60°. Incidentally, the water droplet contact angle of untreated polyolefin resin is around 90°.

The thickness of the primary coating obtained by applying the coating solution containing a silicon compound or hydrolysate thereof with an organic functional group is preferably 2–50 nm. This thickness range is preferred from the standpoint of providing a uniform coating even on bases with complex shapes, and of achieving improvement in adhesive property with silicon dioxide coatings.

The primary coating thickness will be determined by the concentration of the organic silicon compound in the coating solution and by the application conditions, and these must therefore be appropriately selected. The solvent for the coating solution may be an organic solvent such as alcohol, or water.

The method of applying the primary coating may be dipping, spraying, flow coating or the like.

The silicon compound of general formula (1) is represented by $$R^1_n Si(R^2)_{4-n} \quad (1)$$

where $R^1$ is an organic functional group with a methacryloxy group, $R^2$ is one or a plurality of hydrolyzable groups selected from among alkoxyl groups, acetoxyl groups and chlorine, and n is an integer of up to 3. The following are specific examples of silicon compounds of general formula (1).
3-methacryloxypropylmethyldichlorosilane,
3-methacryloxypropylmethyldimethoxysilane,
3-methacryloxypropylmethylmethoxyethoxysilane,
3-methacryloxypropylmethyldiethoxysilane,
3-methacryloxypropyldimethylacetoxysilane,
3-methacryloxypropylmethyldiacetoxysilane,
3-methacryloxypropylmethylmethoxyacetoxysilane,
3-methacryloxypropylmethylthoxyacetoxysilane,
3-methacryloxypropylmethoxydiethoxysilane,
3-methacryloxypropylmethoxydiacetoxysilane,
3-methacryloxypropylmethoxyethoxyacetoxysilane,
3-methacryloxypropyldimethoxyacetoxysiane,
3-methacryloxypropyldimethoxyethoxysilane,
3-methacryloxypropyltriethoxysilane,
3-methacryloxypropylethoxydiacetoxysilane,
3-methacryloxypropyldiethoxyacetoxysilane,
3-methacryloxypropyltriethoxysilane,
3-methacryloxypropyltriacetoxysilane,
3-methacryloxypropyltrichlorosilane,
2-methacryloxyethylmethyldichlorosiane,
2-methacryloxyethyltrichlorosilane,
2-methacryloxyethylmethyldimethoxysilane
2-methacryloxyethyltrimethoxysilane,
2-methacryloxyethylmethyldiethoxysilane,
2-methacryloxyethyltriethoxysilane,
2-methacryloxyethylmethyldiacetoxysilane,
2-methacryloxyethylethyldiacetoxysilane,
2-methacryloxyethyltriacetoxysilane,
2-methacryloxyethylmethylmethoxyethoxysilane,
2-methacryloxyethyldimethylacetoxysilane,
2-methacryloxyethylmethylmethoxyacetoxysilane,
2-methacryloxyethylmethylethoxyacetoxysilane,
2-methacryloxyethylmethoxydiethoxysilane,
2-methacryloxyethylmethoxydiacetoxysilane,
2-methacryloxyethylmethoxyethoxyacetoxysilane,
2-methacryloxyethyldimethoxyacetoxysilane,
2-methacryloxyethyldimethoxyethoxysilane,
2-methacryloxyethylethoxydiacetoxysilane,
2-methacryloxyethyldiethoxyacetoxysilane,
methacryloxymethylmethyldichlorosilane,
methacryloxymethyltrichlorosilane,
methacryloxymethylmethyldimethoxysilane,
methacryloxymethyltrimethoxysilane,
methacryloxymethylmethyldiethoxysilane,
methacryloxymethyltriethoxysilane,
methacryloxymethyldimethoxysilane,
methacryloxymethyldiethoxysilane,
methacryloxymethylmethyldiacetoxysilane,
methacryloxymethylmethylmethoxyacetoxysilane,
methacryloxymethyldimethoxyacetoxysilane,
methacryloxymethylmethoxyethoxyacetoxysilane,
methacryloxymethyldiethoxyacetoxysilane,
methacryloxymethylmethylmethoxyethoxysilane,
methacryloxymethyldimethylacetoxysilane,
methacryloxymethylmethylethoxyacetoxysilane,
methacryloxymethylmethoxydiacetoxysilane,
methacryloxymethyldimethoxyethoxysilane,
methacryloxymethylethoxydiacetoxysilane,
methacryloxymethyltriacetoxysilane,
2-methacryloxyethylmethylmethoxyacetoxysilane,
2-methacryloxyethyldimethoxyacetoxysilane,
2-methacryloxyethylmethylethoxyacetoxysilane,
2-methacryloxyethyldiethoxyacetoxysilane,
2-methacryloxyethylmethyldichlorosilane,
2-methacryloxyethylmethyldimethoxysilane,
2-methacryloxyethylmethylmethoxyethoxysilane,
2-methacryloxyethylmethyldiethoxysilane,
2-methacryloxyethyldimethylacetoxysilane,
2-methacryloxyethylmethyldiacetoxysilane,
2-methacryloxyethylmethoxydiethoxysilane,
2-methacryloxyethylmethoxydiacetoxysilane,
2-methacryloxyethylmethoxyethoxyacetoxysilane, 2-methacryloxyethyldimethoxyacetoxysilane,
2-methacryloxyethyldimethoxyethoxysilane,
2-methacryloxyethyltrimethoxysilane,
2-methacryloxyethylethoxydiacetoxysilane,
2-methacryloxyethyltriethoxysilane,
2-methacryloxyethyltriacetoxysilane,
2-methacryloxyethyltrichlorosilane An ester group is present in the organic silicon-containing coating obtained by silicon compounds or their hydrolysates wherein $R^1$ of the compound of general formula (1) is a methacryloxypropyl group. If an ester group is included in the organic silicon-containing compound, the adhesive property is improved when the silicon dioxide film is deposited on the film from the silicofluoric acid solution, although the reason for this phenomenon is not fully understood.

The silicon compound of general formula (2) is represented by

$$R^3{}_n Si(R^2)_{4-n} \quad (2)$$

where $R^3$ is an organic functional group with a functional group selected from among methacryloxy, vinyl, allyl and amino groups, $R^2$ is one or a plurality of hydrolyzable groups selected from among alkoxyl groups, acetoxyl groups and chlorine, and n is an integer of up to 3. The following are specific examples of silicon compounds of general formula (2), in addition to those mentioned above for general formula (1).
vinylmethyldichlorosilane,
vinyltrichlorosilane,
vinylmethyldimethoxysilane,
vinyltrimethoxysilane,
vinylmethyldiethoxysilane,
vinyltriethoxysilane,
vinylmethyldiacetoxysilane,
vinyltriacetoxysilane,
allylmethyldichlorosilane,
allyltrichlorosilane,
allylmethyldimethoxysilane,
allyltrimethoxysilane,
allylmethyldiethoxysilane,
allyltriethoxysilane,
allylmethyldiacetoxysilane,
allyltriacetoxysilane,
3-(N-allylamino)propylmethyldichlorosilane,
3-(N-allylamino)propyltrichlorosilane,
3-(N-allylamino)propylmethyldimethoxysilane,
3-(N-allylamino)propyltrimethoxysilane,
3-(N-allylamino)propylmethyldiethoxysilane,
3-(N-allylamino)propyltriethoxysilane,
3-(N-allylamino )propylmethyldiacetoxysilane,
3-(N-allylamino)propyltriacetoxysilane,
3-aminopropylmethyldichlorosilane,
3-aminopropyltrichlorosilane,
3-aminopropylmethyldimethoxysilane,
3-aminopropyltrimethoxysilane,
3-aminopropylmethyldiethoxysilane,
3-aminopropyltriethoxysilane,
3-aminopropylmethyldiacetoxysilane,
3-aminopropyltriacetoxysilane,
N-(2-aminoethyl)-3-aminopropylmethyldichlorosilane,
N-(2-aminoethyl)-3-aminopropyltrichlorosilane,
N-(2-aminoethyl)-3-aminopropylmethyldimethoxysilane,
N-(2-aminoethyl)-3-aminopropyltrimethoxysilane,
N-(2-aminoethyl)-3-aminopropylmethyldiethoxysilane,
N-(2-aminoethyl)-3-aminopropyltriethoxysilane,
N-(2-aminoethyl)-3-aminopropylmethyldiacetoxysilane,
N-(2-aminoethyl)-3-aminopropyltriacetoxysilane Since a primary coating obtained from a silicon compound wherein $R^3$ in general formula (2) has an amino group will include large amounts of amino groups that exhibit powerful interaction with the carboxyl groups or hydroxyl groups on the uppermost surface of the hydrophilic treated polyolefin resin, the interface adhesive property between the resin base and the primary coating is improved.

For example, it is possible to form a uniform silicon dioxide coating even over a primary coating containing only a silicon compound in which $R^1$ of general formula (1) is a methacryloxy group, and to thereby improve the coating adhesive property, as explained above. However, for even more improved coating adhesive property, there may be used a primary coating formed from at least 2 different compounds of the compounds of general formula (2) of the invention.

In the case of a primary coating obtained using only a silicon compound in which $R^3$ of general formula (2) is a functional group with an amino group, the hydrophilic nature of the silicon compound with the amino group results in its elution when the silicofluoric acid solution containing silicon dioxide in a supersaturated state is later contacted therewith to form the silicon dioxide coating, thus inhibiting formation of a uniform film with the silicon dioxide coating.

If the starting material for the primary coating includes a silicon compound in which $R^3$ of general formula (2) is an amino group in combination with a silicon compound containing a reactive group of low hydrophilic nature such as methacryloxy, vinyl or allyl as $R^3$, the subsequent formation of the silicon dioxide coating can be carried out in a uniform manner. While the reason allowing uniform formation of the silicon dioxide coating is not fully understood, it is conjectured that it facilitates orientation of the organic functional groups in the coating toward the resin interface and of the silanol groups toward the silicon dioxide coating.

The amino group-containing silicon compound is preferably in the range of 0.01–70 wt % of the total silicon compounds in the coating solution. If the amino group-containing silicon compound is present at less than 0.01 wt % it may not be possible to achieve an effect of improved adhesive property. On the other hand, it is preferably not greater than 70 wt % because this will prevent the silicon dioxide coating from becoming a uniform film.

However, it is not always necessary to use a substance including a silicon compound wherein $R^3$ of general formula (2) contains an amino group, and several compounds may be used in combination from among methacryloxy, vinyl and allyl group-containing compounds. This will, however, result in slightly inferior adhesive property with the olefin resin, as compared to using, as one of the components, a silicon compound wherein $R^3$ of formula (2) contains an amino group.

The polyolefin resin base with the primary coating formed thereon is contacted with a silicofluoric acid solution containing silicon dioxide in a supersaturated state, to form a silicon dioxide coating on the primary coating. The silicofluoric acid ($H_2SiF_6$) solution with silicon dioxide in a supersaturated state (hereunder referred to as the "treatment solution") may be prepared with silicon dioxide in the super saturated state by such means as dissolving silicon dioxide (silica gel, aerogel, silica glass or some other silicon dioxide-containing substance) in a silicofluoric acid solution and then adding water or a reagent (such as boric acid, aluminum chloride, metallic aluminum or the like) or raising the temperature of the treatment solution.

According to the invention, the concentration of the silicofluoric acid in the treatment solution that is contacted with the primary coating-applied polyolefin resin molded base is preferably 1–4 moles/liter, and an especially fast coating formation rate, for more efficient coating formation, can be achieved by first saturating silicon dioxide in a silicofluoric acid solution with a concentration of greater than 3 moles/liter and then diluting with water to a concentration of 1–4 moles/liter.

The treatment solution is preferably:

(a) a treatment solution wherein supersaturation is constantly maintained even during contact with the resin base by such means as ① continuously adding and mixing therewith an additive aqueous solution of boric acid or aluminum chloride, ② dissolving and mixing therewith a metal such as aluminum, or ③ momentarily cooling the temperature for silicon dioxide saturation and then raising the temperature again, and (b) a treatment solution wherein at least 3% of the total amount of treatment solution is filtered through a filter per minute, and circulated.

From the standpoint of improving the coating formation rate it is preferred to ① continuously add and mix an aqueous solution of boric acid or the like or ② dissolve and mix a metal such as aluminum, during contact with the resin base. For boric acid, the amount added is preferably in the range of $5 \times 10^{-4}$ moles/hr to $1.0 \times 10^{-3}$ moles/hr with respect to one mole of the silicofluoric acid in the treatment solution, and for dissolution of metallic aluminum, the dissolution amount is preferably in the range of $1 \times 10^{-3}$ moles/hr to $4 \times 10^{-3}$ moles/hr with respect to one mole of the silicofluoric acid in the treatment solution.

Circulation of a treatment solution with a silicofluoric acid concentration of at least 3% is effective in order to continuously obtain a uniform coating, and filtration of the treatment solution with a filter is preferred in order to obtain a coating with no irregular shapes.

When the treatment solution is placed in an immersion tank for contact with the resin base, a smooth uniform coating can be effectively obtained if the treatment solution is circulated by laminar flow on the surface of the immersed base resin.

The silicon dioxide coating obtained by such a deposition method will contain adsorbed moisture and silanol groups, and these are preferably removed by heat treatment of the coating with high frequency waves.

Since it is thereby possible to form a silicon dioxide coating with excellent adhesive property on the polyolefin resin surface, the highly adhesive silicon dioxide coating inhibits release of the trace gases (plasticizer, $H_2O$, etc.) in the resin, thus enhancing the excellent features of the polyolefin resin such as low moisture absorption, heat resistance, chemical resistance and the like, and rendering it suitable for such uses as optical parts, electronic parts and automobile parts.

In particular, since release of trace gases in the resin is inhibited by the highly adhesive silicon dioxide coating even when a magnetic film is formed on the silicon dioxide coating, there is no risk of deteriorated crystallinity of the magnetic film due to release of the trace gases. The present invention products therefore have even greater potential for use in electronic devices such as magnetic recording media.

The silicon dioxide-coated polyolefin resin obtained according to the invention can be applied to personal and industrial use electronic devices including plates for magnetic disks (HDDs, etc.) and to optical lenses, optical fibers, optical disks and other optical devices, as well as to the various products mentioned below.

Because of the excellent electrical insulating properties of polyolefin resins, their applications include coating materials for wiring and cables, and general insulating materials for OA devices such as copy machines, computers, printers and the like and measuring instruments; circuit boards such as hard printed circuit boards, flexible printed circuit boards and multilayer printed wiring boards, as well as high frequency circuit boards for satellite communication devices which require particularly high frequency properties; base materials for transparent conductive films and sheets in liquid crystal panels, optical memories, and surface heaters such as defrosters for automobiles and aircraft; semiconductor sealing materials and parts for transistors, ICs, LSIs, LEDs and the like; sealing materials for electric and electronic parts such as motors, connectors, switches and sensors; body materials for television sets and video cameras or housing materials for various measuring instruments; structural members for parabolic antennas, flat antennas, radar domes and the like; as well as films, sheets, helmets, etc.

PREFERRED EMBODIMENTS OF THE INVENTION

Example 1

A base obtained by extrusion molding of a cycloolefin by Nihon Zeon, KK. (Model No. 1020R) (size: 100 mm×150 mm×2 mmt) was subjected to corona discharge treatment at a rate of 5 mm per second using a "Corona Master" PS-1M corona discharge surface-modifying apparatus by Shinko Electrical Instruments, KK., at a maximum output of about 14,000 volts variable voltage and a frequency of approximately 15 kHz, to give a polyolefin base surface with a water contact angle of 40°.

Next, an ethanol solution containing 1 wt % 3-methacryloxypropyltrimethoxysilane was prepared, an amount of water necessary for hydrolysis of the methoxy groups was added, and the mixture was stirred to make a coating solution. This coating solution was applied onto the corona discharge-treated resin base by dipping, and natural drying formed a primary coating with a thickness of 10 nm.

The primary coating-covered resin base was then immersed in a silicofluoric acid ($H_2SiF_6$) solution at a concentration of 2.5 moles/liter with silicon dioxide in a supersaturated state at a liquid temperature of 30° C. The immersion time was the time required to obtain a 100 nm-thick silicon dioxide coating. After then removing out the resin base and rinsing it with water, it was dried in an oven at 50° C. for one hour. The silicon dioxide coating formed on the resin base was uniform and exhibited no irregularities or other problems in its outer appearance.

The adhesive property of the coating was evaluated immediately after its formation (initial) and after a moisture resistance test (40° C., 95% RH, 200 h), by a method in which cellophane tape by Nichiban, KK. was pasted onto the silicon dioxide coating and then forcefully peeled off. Only partial peeling of the coating was seen after the moisture resistance test, and no problems of adhesive property were found in the initial test.

Example 2

The cycloolefin base by Nihon Zeon, KK. used in Example 1 was irradiated with UV rays using a UV lamp by Samco International Laboratories (Stock No.: SGL-18W18S-SA1), with direct UV irradiation of 20 mW/cm² under the lamp, and this produced ozone on the base to decompose the oil and dirt on the base surface. The UV ozone treatment was carried out for 15 minutes, until the resin base surface exhibited a water contact angle of 13°.

When a primary coating and silicon dioxide coating were formed by the same method as Example 1 and the coating adhesive property was evaluated also by the same method as Example 1, only partial peeling of the coating was seen after the moisture resistance test, and no problems of adhesive property were found in the initial test.

Example 3

After hydrophilic treatment of a polyolefin base surface by the same method as Example 2, except that the U ozone treatment time was 5 minutes (base surface water contact angle of 47°), a primary coating (thickness: 10 nm) and silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 4

After hydrophilic treatment of a polyolefin base surface by the same method as Example 2, except that the UV ozone treatment time was 2 minutes (base surface water contact angle of 60°), a primary coating (thickness: 10 nm) and silicon dioxide coating (thickness: 100 nm) were formed and the coating adhesive property was evaluated by the same method as Example 1; only very slight peeling of the coating occurred.

Example 5

After hydrophilic treatment of a polyolefin base surface by the same method as Example 2, except that the UV ozone treatment time was 30 minutes (base surface water contact angle of 5°), a primary coating (thickness: 2 nm) and silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 6

After hydrophilic treatment of a polyolefin base surface by the same method as Example 2, except that the UV ozone treatment time was 30 minutes (base surface water contact angle of 5°), a primary coating (thickness: 50 nm) and silicon dioxide coating (thickness: 20 nm) were formed and the coating adhesive property was evaluated by the same method as Example 1; only partial peeling of the coating was seen after the moisture resistance test, and no problems of adhesive property were found in the initial test.

Example 7

After hydrophilic treatment of a polyolefin base surface by the same method as Example 2, except that the UV ozone treatment time was 5 minutes (base surface water contact angle of 47°) and 3-methacryloxypropyltriethoxysilane was used instead of 3-methacryloxypropyltrimethoxysilane, a primary coating (thickness: 10 nm) and silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 8

After hydrophilic treatment of a cycloolefin base surface by the same method as Example 2, except that the UV ozone treatment time was 5 minutes (base surface water contact angle of 40°) and 3-methacryloxypropylmethyldimethoxysilane was used instead of 3-methacryloxypropyltrimethoxysilane, a primary coating (thickness: 5 nm) and silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 9

A base obtained by extrusion molding of the cycloolefin by Nihon Zeon, KK. (Model No. 1020R) used in Example 1 was subjected to plasma treatment for 2 minutes using a Plasma Reactor Model PR-501A by Yamato Kagaku, KK. under conditions of 13.56 MHz high frequency (output: 100–200 W) in $O_2$ gas (flow rate: 100 ml/min), to give a resin base surface with a water contact angle of 20°.

A primary coating (thickness: 10 nm) made of 3-methacryloxypropyltrimethoxysilane and a silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 10

The cycloolefin base by Nihon Zeon, KK. used in Example 1 was treated using an OM-2 ozone water generating apparatus by Sasakura Co. under conditions with immersion of the base in ozone water at room temperature for 4 minutes, to give a resin base surface with a water contact angle of 48°.

A primary coating and silicon dioxide coating were formed and the coating adhesive property was evaluated by the same method as Example 1; only partial peeling of the coating was seen after the moisture resistance test, and no problems of adhesive property were found in the initial test.

Example 11

After hydrophilic treatment of a base (size: 100 mm×150 mm×2 mmt) obtained by extrusion molding of a commercially available polypropylene instead of the cycloolefin by Nihon Zeon, KK. (Model No. 1020R) in the same manner as Example 1 (base surface water contact angle of 40°), a primary coating (thickness: 10 nm) and a silicon dioxide coating (thickness: 100 nm) were formed and the coating adhesive property was evaluated by the same method as Example 1; only partial peeling of the coating was seen after the moisture resistance test, and no problems of adhesive property were found in the initial test.

Example 12

An ethanol solution was prepared containing 0.2 wt % of 3-aminopropyltrimethoxysilane and 1.0 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1, and evaluation of the coating adhesive property also by the same method as Example 1 revealed absolutely no peeling of the coating even after a moisture resistance test.

Example 13

After hydrophilic treatment of a polyolefin resin base surface in the same manner as Example 1 (water droplet contact angle of 40°) except that the corona discharge treatment rate was 1 mm per second, a primary coating (thickness: 10 nm) and silicon dioxide coating (thickness: 100 nm) were formed by the same method as Example 1 using the coating solution of Example 12; evaluation of the coating adhesive property also by the same method as Example 1 revealed absolutely no peeling of the coating even after a moisture resistance test.

Example 14

After hydrophilic treatment of a polyolefin resin base surface in the same manner as Example 1 (water droplet contact angle of 40°) except that the corona discharge treatment rate was 10 mm per second, a primary coating (thickness: 10 nm) and silicon dioxide coating (thickness: 100 nm) were formed by the same method as Example 1 using the coating solution of Example 12; evaluation of the coating adhesive property also by the same method as Example 1 revealed absolutely no peeling of the coating even after a moisture resistance test.

Example 15

After hydrophilic treatment of a polyolefin resin base surface using a plasma treatment apparatus in the same manner as Example 9 (water droplet contact angle of 20°), a primary coating (thickness: 10 nm) and a silicon dioxide coating (thickness: 100 nm) were formed by the same method as Example 1 using the coating solution of Example 12; evaluation of the coating adhesive property also by the same method as Example 1 revealed absolutely no peeling of the coating even after a moisture resistance test.

Example 16

A polyolefin resin base was subjected to ozonized water washing and the resin base surface was subjected to hydrophilic treatment in the same manner as Example 10 (water droplet contact angle of 48°), and then a primary coating and silicon dioxide coating were formed by the same method as Example 1 using the coating solution of Example 12; evaluation of the coating adhesive property also by the same method as Example 1 revealed absolutely no peeling of the coating even after a moisture resistance test.

Example 17

After hydrophilic treatment of a polyolefin resin base surface using a UV lamp in the same manner as Example 2 (water droplet contact angle of 13°), a primary coating (thickness: 10 nm) and silicon dioxide coating (thickness: 100 nm) were formed by the same method as Example 1 using the coating solution of Example 12; evaluation of the coating adhesive property also by the same method as Example 1 revealed absolutely no peeling of the coating even after a moisture resistance test.

Example 18

After hydrophilic treatment of a polyolefin resin base surface using a UV lamp in the same manner as Example 2 except that the treatment time was 5 minutes (water droplet contact angle of 47°), a primary coating (thickness: 10 nm) and silicon dioxide coating (thickness: 100 nm) were formed by the same method as Example 1 using the coating solution of Example 12; evaluation of the coating adhesive property also by the same method as Example 1 revealed absolutely no peeling of the coating even after a moisture resistance test.

Example 19

An ethanol solution was prepared containing 0.8 wt % of 3-methacryloxypropyltrimethoxysilane and 0.2 wt % of 3-aminopropyltrimethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1, and the coating adhesive property was also evaluated by the same method as Example 1. The haze value after a moisture resistance test was higher, but absolutely no peeling of the coating was found.

Example 20

An ethanol solution was prepared containing 0.1 wt % of N-(2-aminoethyl)-3-aminopropyltrimethoxysilane and 1.0 wt % of vinyltrimethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 21

An ethanol solution was prepared containing 0.3 wt % of 3-aminopropyltriethoxysilane and 0.7 wt % of 3-(N-allylamino) propyltrimethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 22

A Faineta A-10 (alcohol mixture by Ueno Chemicals, KK.) solution was prepared containing 0.7 wt % of 3-aminopropyltriethoxysilane and 0.3 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 23

A Faineta A-10 (alcohol mixture by Ueno Chemicals, KK.) solution was prepared containing 0.04 wt % of 3-aminopropyltriethoxysilane and 0.36 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 24

A Faineta A-10 (alcohol mixture by Ueno Chemicals, KK.) solution was prepared containing 0.01 wt % of 3-aminopropyltriethoxysilane and 1.0 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 25

A Faineta A-10 (alcohol mixture by Ueno Chemicals, KK.) solution was prepared containing 1.0 wt % of 3-aminopropyltriethoxysilane and 1.0 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 26

An ethanol solution was prepared containing 0.0002 wt % of 3-aminopropyltriethoxysilane and 1.0 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating was then formed (thickness: 100 nm) by the same method as Example 1; evaluation of the coating adhesive property also by the same method as Example 1 revealed absolutely no peeling of the coating even after a moisture resistance test.

Example 27

An ethanol solution was prepared containing 0.2 wt % of 3-aminopropyltriethoxysilane and 1.0 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 except that the corona discharge treatment rate was 100 mm per second (water droplet contact angle of 60°), the coating solution was used to form a primary coating to a thickness of 10 nm by the same method as Example 1. A silicon dioxide coating (thickness: 50–100 nm, with thickness variance) was also formed by the same method as Example 1, and evaluation of the coating adhesive property also by the same method as Example 1 revealed absolutely no peeling of the coating even after a moisture resistance test.

Example 28

An ethanol solution was prepared containing 0.4 wt % of 3-methacryloxypropyltrimethoxysilane and 0.4 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), the coating solution was used to form a primary coating to a thickness of 10 nm by the same method as Example 1. A silicon dioxide coating (thickness: 50–100 nm, with thickness variance) was formed by the same method as Example 1, and evaluation of the coating adhesive property also by the same method as Example 1 revealed only partial peeling of the coating after the moisture resistance test, while there were no problems of adhesive property in the initial test.

Example 29

An ethanol solution was prepared containing 0.4 wt % of 3-aminopropyltrimethoxysilane and 0.04 wt % of vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), the coating solution was used to form a primary coating to a thickness of 10 nm by the same method as Example 1. A silicon dioxide coating (thickness: 50–100 nm, with thickness variance) was formed by the same method as Example 1, and evaluation of the coating adhesive property also by the same method as Example 1 revealed absolutely no peeling of the coating even after a moisture resistance test.

Comparative Example 1

A base obtained by extrusion molding of a cycloolefin by Nihon Zeon, KK. (Model No. 1020R) (size: 100 mm×150 mm×2 mmt) was subjected to corona discharge treatment at a rate of 5 mm per second using the same apparatus used in Example 1, at a maximum output of about 14,000 volts variable voltage and a frequency of approximately 15 kHz, to give a cycloolefin base surface with a water contact angle of approximately 40°.

Next, a 1% ethyl alcohol solution of 3-glycidoxypropyltrimethoxysilane was prepared, an amount of water necessary for hydrolysis of the methoxy groups was added, and the mixture was stirred to make a coating solution. This coating solution was applied onto the corona discharge-treated resin base by dipping, and natural drying formed a primary coating with a thickness of 10 nm.

It was then attempted to form a silicon dioxide coating on the resin base using a silicofluoric acid ($H_2SiF_6$) solution containing supersaturated silicon dioxide in the same manner as Example 1, but no silicon dioxide coating could be formed.

Comparative Example 2

After hydrophilic treatment of a cycloolefin base surface by the same method as Example 1 except that 3-aminopropyltrimethoxysilane was used instead of the 3-methacryloxypropyltrimethoxysilane in Example 1 (contact angle of 40°) and then formation of a primary coating (thickness: 10 nm), it was attempted to form a silicon dioxide coating thereover, but no silicon dioxide coating could be obtained.

Comparative Example 3

It was attempted to form a silicon dioxide coating on a cycloolefin base by the same method as Example 1, except that no primary coating was formed after hydrophilic treatment of the cycloolefin base surface by the same method as Example 1 (contact angle of 40°), but no silicon dioxide coating could be obtained.

Comparative Example 4

After forming a primary coating (thickness: 10 nm) on a cycloolefin base surface by the same method as Example 1 without the hydrophilic treatment by corona discharge as in Example 1 (pure water contact angle of resin base surface: 90°), a silicon dioxide coating (thickness: 100 nm) was formed thereon and the adhesive property of the silicon dioxide coating was evaluated; almost all of the surface peeled where the cellophane tape had been pasted.

Comparative Example 5

A silicon dioxide coating (thickness: 100 nm) was formed by high frequency sputtering on a cycloolefin base surface (quartz glass target, 0.4 Pa argon atmosphere, 500 W high frequency applied to target) without the hydrophilic treatment by corona discharge in Example 1 (pure water contact angle of resin base surface: 90°) and without forming a primary coating. Upon evaluation of the adhesive property of the silicon dioxide coating, almost all of the surface peeled where the cellophane tape had been pasted.

Comparative Example 6

The same type of base as in Example 1, obtained by extrusion molding of a cycloolefin by Nihon Zeon, KK. (Model No. 1020R) was subjected to plasma treatment in the same manner as Example 9 to give a resin base surface with a water contact angle of 20°.

A primary coating (thickness: 10 nm) and silicon dioxide coating (thickness: 100 nm) were formed and the adhesive property was evaluated by the same method as Example 1; almost all of the surface peeled where the cellophane tape had been pasted.

Comparative Example 7

The same type of base as in Example 1, obtained by extrusion molding of a cycloolefin by Nihon Zeon, KK. (Model No. 1020R) was subjected to corona discharge treatment at a rate of 5 mm per second using the same apparatus used in Example 1, at a maximum output of about 14,000 volts variable voltage and a frequency of approximately 15 kHz, to give a cycloolefin base surface with a water contact angle of approximately 40°.

Next, there was prepared a 1% ethyl alcohol solution of a mixture of two silanes in a proportion such that the $SiO_2$ equivalent weight of tetraethoxysilane (B) to the $SiO_{3/2}$ equivalent weight of 3-methacryloxypropyltrimethoxysilane (A) (B/A) was 0.2, an amount of water necessary for hydrolysis of the methoxy groups was added, and the mixture was stirred to make a coating solution. This coating solution was applied onto the corona discharge-treated resin base by dipping, and natural drying formed a primary coating with a thickness of 10 nm.

A silicon dioxide coating was then formed on the resin base by the same method as Example 1, and the adhesive property was evaluated by the same method as Example 1; almost all of the surface peeled where the cellophane tape had been pasted.

Comparative Example 8

After hydrophilic treatment of a polyolefin resin base surface in the same manner as Example 1 except that the corona discharge treatment rate was 100 mm per second (water droplet contact angle of 60°), a primary coating (thickness: 10 nm) was formed by the same method as Example 1, except that vinyltriethoxysilane was used instead of the 3-methacryloxypropyltrimethoxysilane in Example 1; it was then attempted to form a silicon dioxide coating (thickness: 100 nm) thereover, but a uniform silicon dioxide coating could not be obtained.

Comparative Example 9

An ethanol solution was prepared containing 0.4 wt % of 3-methacryloxypropyltrimethoxysilane and 0.4 wt % of 3-aminopropyltrimethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. It was then attempted to form a silicon dioxide coating (thickness: 100 nm) thereover by the same method as Example 1, but a uniform silicon dioxide coating could not be obtained.

Comparative Example 10

An ethanol solution was prepared containing 0.4 wt % of 3-methacryloxypropyltrimethoxysilane and 0.04 wt % of 3-aminopropyltrimethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. It was then attempted to form a silicon dioxide coating (thickness: 100 nm) thereover by the same method as Example 1, but a uniform silicon dioxide coating could not be obtained.

Comparative Example 11

An ethanol solution was prepared containing 0.4 wt % vinyltriethoxysilane, and then an amount of water required to hydrolyze the hydrolyzable groups was added and adequately stirred therewith to make a coating solution.

After hydrophilic treatment of a polyolefin resin base surface in the same manner as Example 1 (water droplet contact angle of 40°), a primary coating with a thickness of 10 nm was formed by the same method as Example 1 using this coating solution. A silicon dioxide coating (thickness: 100 nm) was then formed thereover by the same method as Example 1, and upon evaluation of the coating adhesive property by the same method as Example 1, almost all of the surface peeled where the cellophane tape had been pasted.

These examples and comparative examples are shown in summary in Tables 1 to 3.

According to the invention it is possible to form silicon dioxide coatings with very satisfactory adhesive property and satisfactory surface coatability for base surfaces of polyolefin resins, and especially cycloolefin resins, and this is effective in providing, for example, ground films for functional thin-films and ground films for adhesives.

TABLE 1

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | After moisture resistance test (40° C., 95%, 200 h) |
|---|---|---|---|---|---|---|---|---|---|---|
| Example 1 | cycloolefin resin | corona discharge, 5 mm/s | 40 | 3-methacryloxypropyltrimethoxysilane, 1.0% | none | 10 | Deposition from $SiO_2$-supersaturated $H_2SiF_6$ solution | 100 | No peeling found on any pasted sections of surface ○ | Partial peeling |
| Example 2 | same as above | UV ozone irradiation, 15 mins. | 13 | Same as above | none | 10 | same as above | 100 | same as above ○ | same as above |
| Example 3 | same as above | UV ozone irradiation, 5 mins. | 47 | Same as above | none | 10 | same as above | 100 | same as above ○ | same as above |
| Example 4 | same as above | UV ozone irradiation, 2 mins. | 60 | Same as above | none | 10 | same as above | 100 | Very slight peeling | same as above |
| Example 5 | same as above | UV ozone irradiation, 30 mins. | Approx. 5 | Same as above | none | 2 | same as above | 100 | No peeling found on any pasted sections of surface ○ | same as above |
| Example 6 | same as above | UV ozone irradiation, 30 mins. | Approx. 5 | Same as above | none | 50 | same as above | 20 | same as above ○ | same as above |
| Example 7 | same as above | UV ozone irradiation, 5 mins. | 47 | 3-methacryloxypropyltriethoxysilane, 1.0% | none | 10 | same as above | 100 | same as above ○ | same as above |
| Example 8 | same as above | UV ozone irradiation, 5 mins. | 40 | 3-methacryloxypropylmethyldimethoxysilane, 1.0% | none | 5 | same as above | 100 | same as above ○ | same as above |
| Example 9 | same as above | plasma treatment | 20 | 3-methacryloxypropyltrimethoxysilane, 1.0% | none | 10 | same as above | 100 | same as above ○ | same as above |
| Example 10 | same as above | ozonized water washing, 4 mins. | 48 | Same as above | none | 10 | same as above | 100 | same as above ○ | same as above |
| Example 11 | polypropylene resin | corona discharge, 5 mm/s | 40 | Same as above | none | 10 | same as above | 100 | same as above ○ | same as above |
| Example 12 | cycloolefin resin | corona discharge, 5 mm/s | 40 | 3-aminopropyltrimethoxysilane, 0.2% | vinyltriethoxysilane, 1.0% | 10 | same as above | 100 | same as above ○ | No peeling found on any pasted sections of surface ○ |

TABLE 1-continued

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | Peeling test with tape After moisture resistance test (40° C., 95%, 200 h) |
|---|---|---|---|---|---|---|---|---|---|---|
| Example 13 | same as above | corona discharge, 1 mm/s | 40 | Same as above | same as above | 10 | same as above | 100 | same as above ○ | same as above ○ |
| Example 14 | same as above | corona discharge, 10 mm/s | 40 | Same as above | same as above | 10 | same as above | 100 | same as above ○ | same as above ○ |
| Example 15 | same as above | plasma treatment | 20 | Same as above | same as above | 10 | same as above | 100 | same as above ○ | same as above ○ |
| Example 16 | same as above | ozonized water washing, 4 mins. | 48 | Same as above | same as above | 10 | same as above | 100 | same as above ○ | same as above ○ |

TABLE 2

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | Peeling test with tape After moisture resistance test (40° C., 95%, 200 h) |
|---|---|---|---|---|---|---|---|---|---|---|
| Example 17 | cycloolefin resin | UV ozone irradiation, 15 mins | 13 | 3-aminopropyl-trimethoxy-silane, 0.2% | vinyl-tri-ethoxy-silane, 1.0% | 10 | Deposition from $SiO_2$-supersaturated $H_2SiF_6$ solution | 100 | No peeling found on any pasted sections of surface ○ | No peeling found on any pasted sections of surface ○ |
| Example 18 | same as above | UV ozone irradiation, 5 mins. | 47 | same as above | same as above | 10 | same as above | 100 | same as above ○ | same as above ○ |
| Example 19 | same as above | corona discharge, 5 mm/s | 40 | 3-methacryloxy-propyl-trimethoxy-silane, 0.8% | 3-amino-propyl trime-thoxy-silane, 0.2% | 10 | same as above | 100 | same as above ○ | No peeling (partial haze) |
| Example 20 | same as above | same as above | 40 | N-(2-aminoethyl)-3-aminopropyl-trimethoxy-silane, 0.1% | vinyl-trime-thoxy-silane, 1.0% | 10 | same as above | 100 | same as above ○ | No peeling found on any pasted sections of surface |
| Example 21 | same as above | same as above | 40 | 3-aminopropyl-triethoxy-silane, 0.3% | 3-(N-allyl-amino)-propyl-trime-thoxy-silane, 0.7% | 10 | same as above | 100 | same as above ○ | same as above ○ |
| Example 22 | same as above | same as above | 40 | 3-aminopropyl-triethoxy-silane, 0.7% | vinyl-tri-ethoxy-silane, 0.3% | 10 | same as above | 100 | same as above ○ | same as above ○ |
| Example 23 | same as above | same as above | 40 | same as above, 0.04% | same as above, 0.36% | 10 | same as above | 100 | same as above ○ | same as above ○ |
| Example 24 | same as above | same as above | 40 | same as above, 0.01% | same as above, 1.0% | 10 | same as above | 100 | same as above ○ | same as above ○ |
| Example 25 | same as above | same as above | 40 | same as above, 1.0% | same as above, 1.0% | 10 | same as above | 100 | same as above ○ | same as above ○ |

TABLE 2-continued

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | Peeling test with tape After moisture resistance test (40° C., 95%, 200 h) |
|---|---|---|---|---|---|---|---|---|---|---|
| Example 26 | same as above | same as above | 40 | same as above, 0.0002% | same as above, 1.0% | 10 | same as above | 100 | same as above ○ | same as above ○ |
| Example 27 | same as above | corona discharge, 100 mm/s | 60 | same as above, 0.2% | same as above, 1.0% | 10 | same as above | Thickness variance from 50–100 | same as above ○ | same as above ○ |
| Example 28 | same as above | corona discharge, 5 mm/s | 40 | 3-methacryloxy-propyl-trimethoxy-silane, 0.4% | vinyl-tri-ethoxy-silane, 0.4% | 10 | same as above | Thickness variance from 50–100 | same as above ○ | Partial peeling |
| Example 29 | same as above | same as above | 40 | 3-aminopropyl-trimethoxy-silane, 0.4% | vinyl-tri-ethoxy-silane, 0.04% | 10 | same as above | Thickness variance from 50–100 | same as above ○ | No peeling found on any pasted sections of surface ○ |

TABLE 3

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | Peeling test with tape After moisture resistance test (40° C., 95%, 200 h) |
|---|---|---|---|---|---|---|---|---|---|---|
| Comparative example 1 | cycloolefin resin | corona discharge, 5 mm/s | 40 | 3-glycidoxy-propyl-trimethoxy-silane, 1.0% | none | 10 | Deposition from SiO$_2$-supersaturated H$_2$SiF$_6$ solution | No coating possible | — | — |
| Comparative example 2 | same as above | same as above | 40 | 3-aminopropyl-trimethoxy-silane, 1.0% | none | 10 | same as above | same as above | — | — |
| Comparative example 3 | same as above | same as above | 40 | none | none | — | same as above | same as above | — | — |
| Comparative example 4 | same as above | none | 90 | 3-methacryloxy-propyl-trimethoxy-silane, 1.0% | none | 10 | same as above | 100 | Peeling over almost entire pasted surface X | — |
| Comparative example 5 | same as above | none | 90 | none | none | — | sputtering | 100 | same as above X | — |
| Comparative example 6 | same as above | plasma treatment | 20 | 3-methacryloxy-propyl-trimethoxy-silane, 1.0% | none | 10 | Deposition from SiO$_2$-supersaturated H$_2$SiF$_6$ solution | 100 | same as above X | — |
| Comparative example 7 | same as above | corona discharge, 5 mm/s | 40 | 3-methacryloxy-propyl-trimethoxy-silane | tetra-ethoxy-silane | 10 | same as above | 100 | same as above X | — |
| Comparative example 8 | same as above | corona discharge, 100 mm/s | 60 | vinyltriethoxy-silane, 0.4% | none | 10 | same as above | No coating possible | — | — |

TABLE 3-continued

| Examples | Resin base | Hydrophilic treatment method | Post-treatment water droplet contact angle (degrees) | Organic silicon coating material 1 | Organic silicon coating material 2 | Film thickness (nm) | Silicon dioxide coating method | Thickness (nm) | Peeling test with tape Initial | After moisture resistance test (40° C., 95%, 200 h) |
|---|---|---|---|---|---|---|---|---|---|---|
| Comparative example 9 | same as above | corona discharge, 5 mm/s | 40 | 3-methacryloxy-propyl-trimethoxy-silane, 0.4% | 3-amino-propyl-trime-thoxy-silane, 0.4% | 10 | same as above | same as above | — | — |
| Comparative example 10 | same as above | same as above | 40 | 3-methacryloxy-propyl-trimethoxy-silane, 0.4% | 3-amino-propyl-trime-thoxy-silane, 0.04% | 10 | same as above | same as above | — | — |
| Comparative example 11 | same as above | same as above | 40 | vinyltriethoxy-silane, 0.4% | none | 10 | same as above | 100 | Peeling over almost entire pasted surface X | — |

As seen by the results shown in Tables 1 to 3, the examples of the invention had very satisfactory adhesive property on the base surfaces of the polyolefin resins, and silicon dioxide coatings with satisfactory surface coatability were formed.

In particular, the hydrophilic treatment was able to guarantee satisfactory adhesive property with a water contact angle of 5–60°.

Among the compounds of general formulas (1) and (2), methacryloxysilane, vinylsilane and allylsilane exhibited relatively high resistance against $H_2SiF_6$, while aminosilane exhibited no resistance against $H_2SiF_6$. However, adhesive property for the hydrophilic treated polyolefin was relatively higher with aminosilane while the adhesive property was relatively lower for methacryloxysilane, vinylsilane and allylsilane.

What is claimed is:

1. A silicon dioxide-coated polyolefin resin which is obtained by a production process for production of a silicon dioxide-coated polyolefin resin, wherein after hydrophilic treatment of the surface of a polyolefin resin, it is coated with a primary coating comprising an organic silicon compound and the surface is then contacted with a solution containing silicofluoric acid with silicon dioxide in a supersaturated state, to form a silicon dioxide coating on the primary coating.

2. A silicone dioxide-coated polyolefin resin which is obtained by a production process for production of a silicon dioxide-coated polyolefin resin according to claim 1, wherein said primary coating is obtained by applying and subsequently drying a coating solution containing a silicon compound or its hydrolysate with an organic functional group represented by general formula $$R^1{}_nSi(R^2)_{4-n} \qquad (1)$$

where $R^1$ is an organic functional group with methacryloxy group, $R^2$ is one or a plurality of hydrolyzable groups selected from the group consisting of alkoxyl groups, acetoxyl groups and chlorine, and n is an integer from 1 to 3, both inclusive.

3. A silicon dioxide-coated polyolefin resin which is obtained by a production process for production of a silicon dioxide-coated polyolefin resin according to claim 1, wherein said primary coating is obtained by applying and subsequently drying a coating solution containing a plurality of different silicon compounds or their hydrolysates from among silicon compounds and their hydrolysates with an organic functional group represented by general formula $$R^3{}_nSi(R^2)_{4-n} \qquad (2)$$

where $R^3$ is an organic functional group with a functional group selected from the group consisting of methacryloxy, vinyl, allyl and amino groups, $R^2$ is one or a plurality of hydrolyzable groups selected from the group consisting of alkoxyl groups, acetoxyl groups and chlorine, and n is an integer from 1 to 3, both inclusive.

4. A silicon dioxide-coated polyolefin resin which is obtained by a production process for production of a silicon dioxide-coated polyolefin resin according to claim 1, wherein said coating solution comprises at least one silicon compound with an amino group.

5. A silicon dioxide-coated polyolefin resin which is obtained by a production process for production of a sililcone dioxide-coated polyolefin resin according to any one of claims 1, 3 or 4, wherein said coating solution comprises one or more amino group-containing silicon compounds and wherein the quantity of amino group-containing silicon compounds among the total quantity of silicon compounds contained in said coating solution is 0.01–70 wt %.

* * * * *